(12) United States Patent
Chang

(10) Patent No.: US 11,101,569 B2
(45) Date of Patent: Aug. 24, 2021

(54) TOROIDAL COMPACT ANTENNA TEST RANGE

(71) Applicant: Dau-Chyrh Chang, Taipei (TW)

(72) Inventor: Dau-Chyrh Chang, Taipei (TW)

( * ) Notice: Subject to any disclaimer, the term of this patent is extended or adjusted under 35 U.S.C. 154(b) by 0 days.

(21) Appl. No.: 16/736,836

(22) Filed: Jan. 8, 2020

(65) Prior Publication Data
US 2021/0210863 A1 Jul. 8, 2021

(51) Int. Cl.
| | | |
|---|---|---|
| *H01Q 19/19* | (2006.01) | |
| *H01Q 1/36* | (2006.01) | |
| *H01Q 15/16* | (2006.01) | |
| *H01Q 19/10* | (2006.01) | |
| *H01Q 7/00* | (2006.01) | |

(52) U.S. Cl.
CPC .............. *H01Q 19/19* (2013.01); *H01Q 1/36* (2013.01); *H01Q 7/00* (2013.01); *H01Q 15/16* (2013.01); *H01Q 19/102* (2013.01)

(58) Field of Classification Search
None
See application file for complete search history.

(56) References Cited

U.S. PATENT DOCUMENTS

| | | | | |
|---|---|---|---|---|
| 3,922,682 A * | 11/1975 | Hyde | ..................... | H01Q 19/19 |
| | | | | 343/761 |
| 5,670,965 A * | 9/1997 | Tuovinen | ............... | G01R 29/10 |
| | | | | 343/703 |
| 10,587,050 B2 * | 3/2020 | Rowell | .............. | G01R 29/0864 |
| 2020/0217885 A1 * | 7/2020 | Rowell | .............. | G01R 31/3025 |
| 2020/0321706 A1 * | 10/2020 | Rowell | .............. | H01Q 13/0275 |

FOREIGN PATENT DOCUMENTS

| | | | | |
|---|---|---|---|---|
| CN | 209764952 U | * | 12/2019 | |
| EP | 3719929 A1 | * | 10/2020 | ......... H01Q 13/0275 |

OTHER PUBLICATIONS

Annular distance-reducing antenna testing device (English) CN 209764952 U Published on Dec. 10, 2019.*

* cited by examiner

*Primary Examiner* — Vibol Tan

(57) ABSTRACT

This invention describes the technology of toroidal CATR (compact antenna test range) for generating multiple directional plane waves propagate toward the center axis of QZ (quiet zone). The toroidal CATR consists of torus as main reflector, sub-reflectors, and the corresponding feed antennas of sub-reflectors. This invention is to provide multiple directional plane waves propagating toward the center axis of torus which is also the center axis of QZ. The performances of QZ in this invention are with larger size of QZ and better electrical performance inside QZ. Due to the capability of multiple directional plane waves propagating toward the center axis of QZ, the complexity of positioner (turntable) for AUT (antenna under test) or radar target RCS (radar cross section) in three dimensional power pattern measurement will be simplified.

11 Claims, 3 Drawing Sheets

| | |
|---|---|
| 100 ······ toroidal reflector | 104 ······ principal curve (circle) |
| 101 ······ center axis of torus, center axis of QZ | 200 ······ antennas under test |
| | 300 ······ quiet zone (QZ) |
| 102 ······ radii of 104 | 400 ······ phase center of feed antenna |
| 103 ····· principal curve (circle, parabola, ellipse, hyperbola, etc.) | 500 ······ sub-reflector |

TOROIDAL COMPACT ANTENNA TEST RANGE

CROSS-REFERENCE TO RELATED APPLICATIONS

N/A

BACKGROUND OF THE INVENTION

In general, the AUT (antenna under test) should be located inside QZ (quite zone). Inside the QZ, the EM (electromagnetic) wave should be a plane wave. The definition of plane wave is that the magnitude and phase of field intensity is uniformly distributed on the wave front of EM wave. In order to have a uniform plane wave for spherical wave front, the distance between transmitting source and AUT inside QZ should be infinity. And there will be not any reflections, refractions, and diffractions along the path of wave propagation. For the commercial applications, the EM field specifications of QZ are with maximum quadratic phase error 22.5°, magnitude taper 1 dB to 2 dB, and ripple for both magnitude and phase are ±0.5 dB and ±6° respectively. In order to reduce the quadratic phase error 22.5°, the distance R between transmitter/receiver and AUT is larger than $2D^2/\lambda$. Where D is the maximum size of AUT and $\lambda$ is the wavelength. In general, the center of AUT is located at the center of QZ, and the maximum size of AUT is less or equal than that of QZ. In order to have larger QZ with maximum quadratic phase error 22.5°, the distance R between transmit/receive source and AUT inside QZ should be large. Since the power density at the receiving antenna is proportional to the $1/R^2$, the larger the distance will cause the less receiving power at the receiver of AUT.

BRIEF SUMMARY OF THE INVENTION

Brief summary of the invention includes in the followings.
 a. This invention uses a torus as the main reflector of CATR (compact antenna test range). The geometry of torus is symmetry. It is easier for manufacturing the toroidal reflector instead of offset paraboloid reflector.
 b. There is not any edge discontinuity for the toroidal main reflector. It is not necessary for edge treatments to reduce the edge diffraction field which contributes to the QZ.
 c. This invention is to provide a simple way to generate multiple directional plane waves propagating toward the center axis of QZ.
 d. This invention is to provide a larger size of QZ with small ripple field intensity.
 e. The complexity of positioner will be simplified for the two and three dimensional power pattern measurement of AUT and radar target RCS (radar cross-section).

BRIEF DESCRIPTION OF THE DRAWING

For more complete understanding of the invention, the descriptions of the following figures are included.

As shown in FIG. 1, any point on the toroidal main reflector 100 is the intersection of two principal curves 103, 104. These two principal curves, 103 and 104, are orthogonal. One of these two orthogonal curves will have either maximum radius of curvature or minimum radius of curvature, vice versa. Principal curve 104 is a circle. Principal curve 103 can be a circle, a parabola, an ellipse, a hyperbola, a straight line, or any smooth curve which can be expressed by a formula. The radii 102 of principal curve 104 depends on the position of principal curve 103. Along the principal curve 103 the center of curvature for principal curve 104 will form a line 101. Line 101 is not only the center axis of torus but also the center axis of QZ 300.

Figure 1:
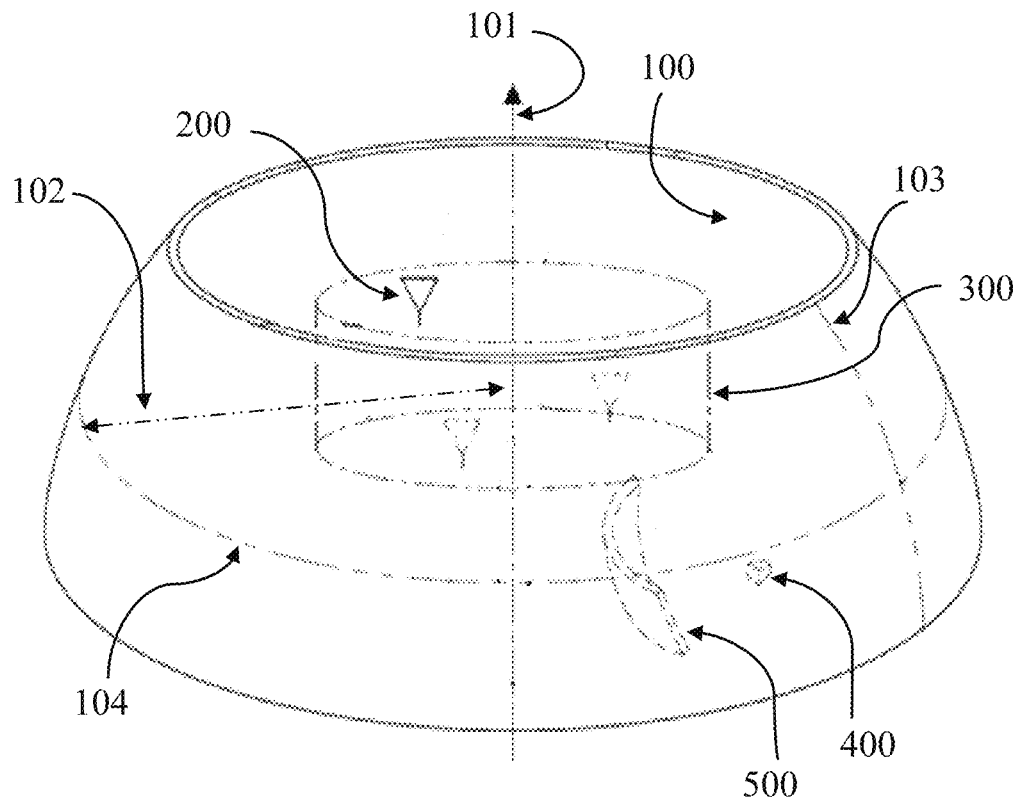
FIG. 1 is a designated figure. The detail explanation is shown in the followings.

The principle curve 104 on the toroidal main reflector 100 is continuous and symmetry, it will not have any issue on edge diffraction for CATR in this invention. The field intensity at the edge of principle curve 103 can be reduced by the field taper of feed antenna 400 and geometry of sub-reflector 500. The total edge diffraction field contributes to the field ripple inside the QZ 300 is easier to control in toroidal CATR.

The geometry of sub-reflector 500 is determined by the position on toroidal main reflector 100 and position of feed antenna 400 according to the Fermat's principle and Snell's law. The spherical wave which radiated by the feed antenna 400 is reflected by sub-reflector. The reflected spherical wave incidents at the toroidal main reflector 100. The wave reflected by the toroidal main reflector is a plane wave 302. This plane wave 302 propagates toward the QZ 300.

Figure 2A:
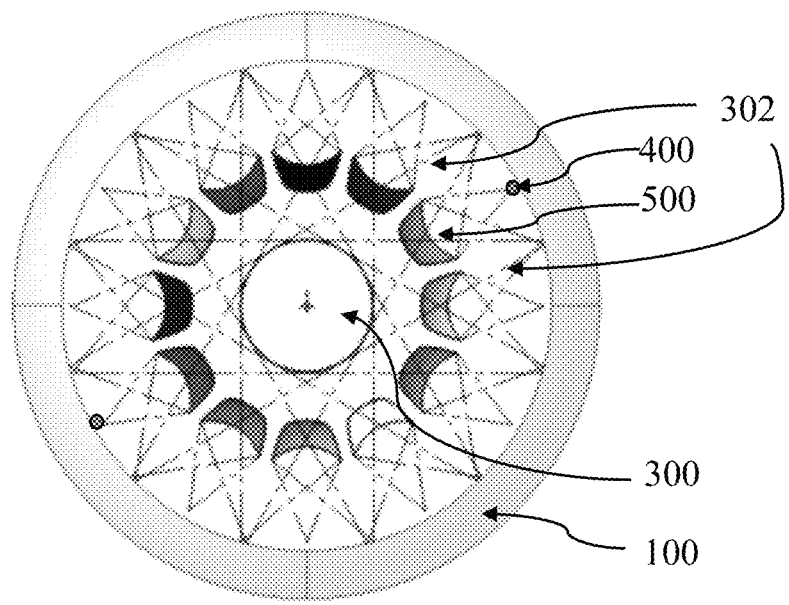
Figure 2B:
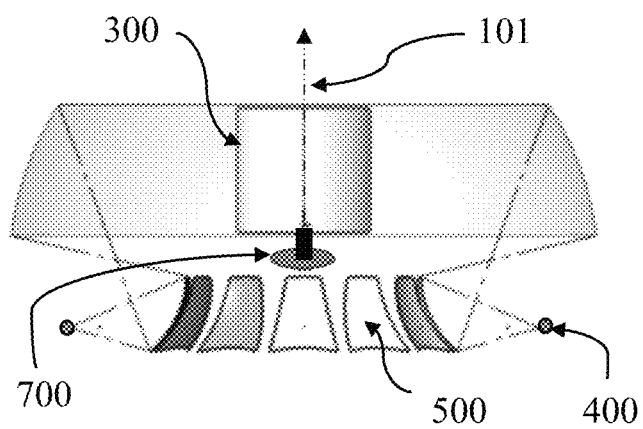

FIG. 2A is the practical example of the invention for generating twelve directional plane waves 302 propagating toward the center axis of QZ 300. FIG. 2A is the top view of toroidal CATR. FIG. 2B is the side view of toroidal CATR. This example includes one toroidal main reflector 100, twelve sub-reflectors 500, twelve feed antennas 400, and QZ 300. Each feed antenna 400 radiates a spherical wave and reflected by the corresponding sub-reflector 500. The reflected wave from each sub-reflector 500 propagates toward part of toroidal main reflector 100. The wave reflected by the toroidal main reflector 100 is a plane wave and propagates toward the QZ 300.

Figure 3A:
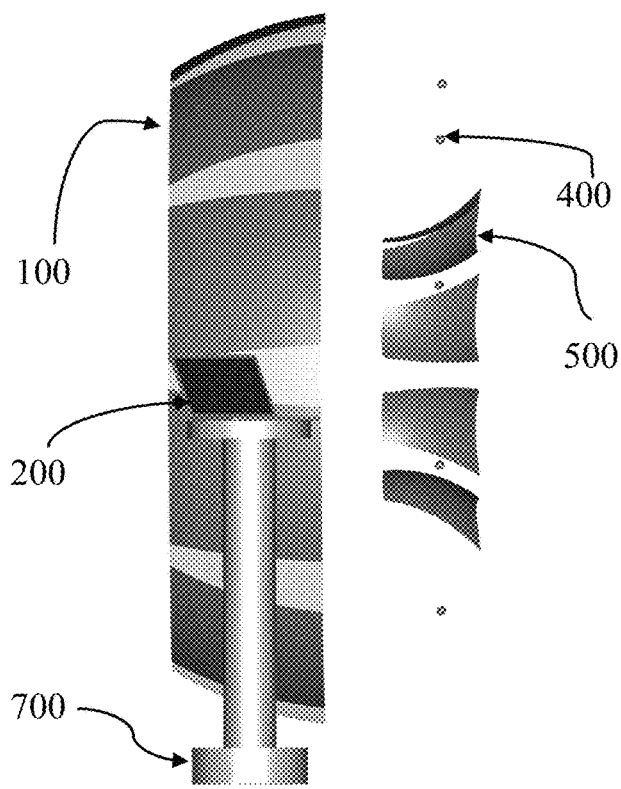
Figure 3B:
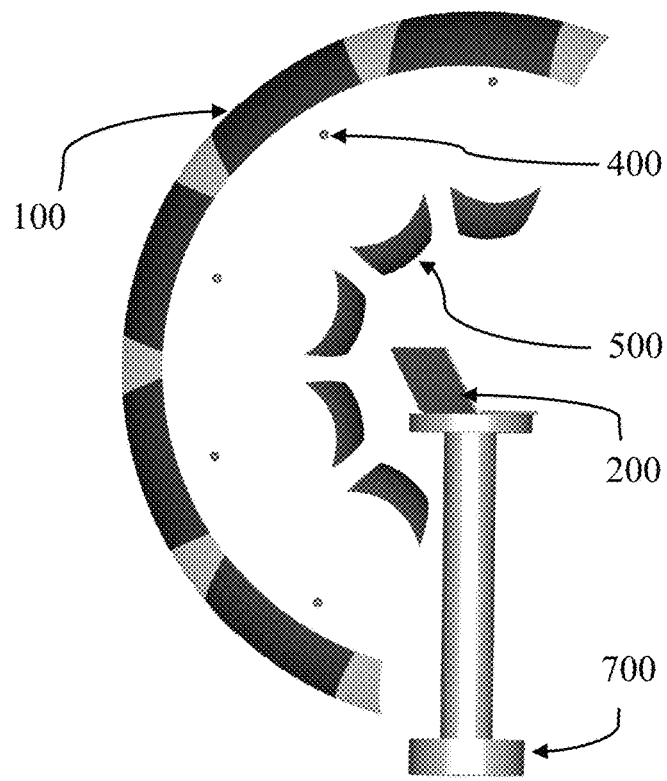

FIG. 3A is another practical example of half toroidal CATR for AUT three dimensional power pattern measurement. FIG. 3A is the side view of the half toroidal CATR. FIG. 3B is the front view the half toroidal CATR. It is easier to see the half torus in FIG. 3B. This example includes one half toroidal main reflector 100, five sub-reflectors 500, five feed antennas 400, and one positioner 700. The plane wave radiates to the QZ 300 from 0° to 180° in theta direction, and the AUT mounted on the antenna positioner 700 which rotates from 0° to 360° in phi direction. Since there are five sub-reflectors 500 and their corresponding five feed antennas 400, each sub-reflector 500 and the corresponding feed antenna 400 will rotate 36° in theta direction. The total rotation angle of five sub-reflectors 500 and the corresponding feed antennas 400 will cover the 180° in theta direction. The coverage of all theta angle (180°) and phi angle (360°) is the antenna three dimensional far field power pattern.

DETAILED DESCRIPTION OF THE INVENTION

This invention describes multiple directional plane waves propagate toward the cylindrical QZ 300 by using a toroidal reflector 100, several sub-reflectors 500, several phase centers of feed antennas 400, and positioner 700. The concave side of toroidal reflector points toward the center axis 101 of torus which is also the center axis of QZ 300. If multiple directional plane waves propagate toward the center axis 101 of QZ 300 are required, the geometry of each sub-reflector 500 and their corresponding phase center of feed antenna 400 can be calculated. By using this toroidal CATR, the radiation patterns of various AUTs or radar target 200 on positioner 700 can be measured simultaneously or in time sequence.

Any point on the toroidal main reflector 100 consist of two orthogonal principal curves 103 and 104. The one of the two principal curves is a circle 104. Another principal curve 103 can be a circle, a parabola, hyperbola, an ellipse, straight line, or any smooth curve which can be expressed by formula. The radii 102 of principal curve 104 depends on the position on principal curve 103.

The geometry of sub-reflector 500 is based on the part area, which is the cross section area of QZ 300, on toroidal main reflector 100 and the position of feed phase center 400. The spherical wave propagates from feed phase center 400 toward the sub-reflector 500. The wave reflected by the sub-reflector 500 and re-radiates toward the toroidal main reflector 100. Then the wave reflected by the main reflector 100 is a plane wave 302 propagating toward the center axis of QZ 300.

The Fermat's principle describes that the phase difference between two wave fronts is a constant. The Snell's law describes the relationship between incident wave, reflected wave, and surface normal at the reflection point on reflector are co-planar. According to the Fermat's principle and Snell's law (refer to other publications [0029] and [0030], respectively), the geometry of sub-reflector can be calculated.

Since the edge continuity of the symmetry torus, it does not necessary for edge treatment to reduce the edge diffraction field radiates toward the QZ 300. The ripple of electric field intensity inside the QZ 300 is small. Except for the edge continuity for improving the electrical performance of QZ 300, the assembly of torus can also use identical parts of metal sheet piece by piece to reduce the complexity in manufacturing.

Traditional antenna positioner for three dimensional AUT or target RCS power pattern measurement should have both theta axis and phi axis. By arrangement of various sub-reflectors 500 and their corresponding feed antennas 400 for generating multiple plane waves propagate toward the center axis of torus which is also the center axis of QZ 300. If the plane waves are in theta (or phi) direction and the antenna positioner 700 is in phi (or theta) direction. Then the three dimensional far field power pattern for antenna or target RCS in both theta and phi directions can be measured simultaneously. The antenna positioner will be simplified for three dimensional power pattern measurement in this invention. Two examples are illustrated in the followings.

FIG. 2A is the top view of toroidal CATR. FIG. 2B is the side view of toroidal CATR. This example includes one toroidal main reflector 100, twelve sub-reflectors 500, twelve feed antennas 400, a positioner 700, and QZ 300. The positioner 700 in this example enters from the larger plane side of torus. Of course, the positioner can also enter from the smaller plane side of torus. Each feed antenna 400 radiates a spherical wave and reflected by the corresponding sub-reflector 500. The reflected wave from each sub-reflector 500 propagates toward part area of toroidal main reflector 100. The wave reflected by the part area on toroidal main reflector 100 is a plane wave 302 as shown in FIG. 2A. The plane wave propagates toward the center axis of QZ 300.

As described in FIG. 2A, the twelve directional plane waves with equal angular coverage propagate toward the QZ 300. If the arrangement of these twelve plane waves is in phi direction of spherical coordination, then the maximum rotation angle of each plane wave is ±15° with the total angular coverage 360° in phi direction. The two dimensional power pattern can be measured without any rotation of AUT in phi direction.

As described in FIG. 2A, this invention will have the capability of generating multiple directional plane waves 302 propagating toward the center axis of QZ 300 simultaneously, either monostatic (transmitter and receiver are at the same positon) RCS or bi-static (transmitter and receiver are at different positions) RCS can also be measured in this toroidal 100 CATR simultaneously.

FIG. 3A is the side view of the half toroidal CATR and FIG. 3B is the front view of the half toroidal CATR. This example includes a half torus 100, five sub-reflectors 500, five feed antennas 400, and one antenna positioner 700. If the vertex of antenna positioner 700 is in z-axis with theta at 0°, then the five directional plane waves are generated and propagating toward the center axis of QZ 300 with theta at 0°, 36°, 72°, 108°, and 144° respectively. If the maximum rotational angle is within ±18° for each plane wave, then the total five directional plane waves will cover total 180° angular coverage in theta direction. If the antenna positioner 700 rotates 360° in phi direction, then the three dimensional far field power pattern for AUT and radar target RCS can be measured with various theta and various phi directions.

For the practical examples as illustrated either in FIG. 2A or FIG. 3A, each pair of sub-reflector 500 and the corresponding feed antenna 400 are similar. For special applications, each pair of sub-reflector 500 and the corresponding feed antenna 400 may not be identical.

(void)

The above descriptions are only parts of the practical examples. This invention will also include the applications by rearrangement of the geometry of toroidal CATR. Therefore, this invention should not be limited only by the spirit and scope of the appended claims.

REFERENCES

Chang, D-C., C-C. Yang, and S-Y Yang. "Dual-reflectors system with a spherical main reflector and shaped subreflector for compact range." *IEE Proceedings-Microwaves, Antennas and Propagation* 144.2 (1997): 97-102.

Chang, Dau-Chyrh, and W. V. T. Rosch. "An offset-fed reflector antenna with an axially symmetric main reflector." *IEEE transactions on antennas and propagation* 32.11 (1984): 1230-1236.

What is claimed is:

1. A toroidal compact antenna test range measurement system, configured to measure a three-dimensional far field power pattern of at least one antenna under test or a radar cross section of at least one radar target, the toroidal compact antenna test range measurement system comprising:
a main reflector, a plurality of sub-reflectors, a plurality of feed antennas, and a positioner, wherein the main reflector is a full torus or a partial torus, the plurality of feed antennas are disposed in corresponding to the plurality of sub-reflectors, and the plurality of the sub-reflectors are supported by the positioner,
wherein a reflecting surface of the main reflector is formed by a first principal curve and a second principal curve, the first principal curve is a circle, the second principal curve is any of a parabola, a hyperbola, an ellipse, a circle, a straight line, or a curve expressible by a mathematical formula, and the first principal curve and the second principal curve are orthogonal to each other, wherein the positioner is rotatable from 0 degree to 360 degree.

2. The toroidal compact antenna test range system as recited in claim 1, wherein the plurality of sub-reflectors and the plurality of the feed antennas are disposed around a center axis of the main reflector, the plurality of feed antennas generate a plurality of plane waves and propagate toward a center axis of quiet zone simultaneously or in time sequence.

3. The toroidal compact antenna test range system as recited in claim 1, wherein the main reflector is the full torus integrally formed by one single torus structure.

4. The toroidal compact antenna test range system as recited in claim 1, wherein the main reflector is the partial torus integrally formed by one single partial torus structure.

5. The toroidal compact antenna test range system as recited in claim 1, wherein the main reflector is formed by connecting multiple partial torus structures.

6. The toroidal compact antenna test range system as recited in claim 1, wherein the plane surface of the main reflector is perpendicular to the positioner.

7. The toroidal compact antenna test range system as recited in claim 1, wherein the plane surface of the main reflector is parallel to the positioner.

8. The toroidal compact antenna test range system as recited in claim 1, wherein the positioner is disposed in a plane surface of the main reflector.

9. The toroidal compact antenna test range system as recited in claim 1, wherein a coverage angle of the plurality of sub-reflectors is inversely proportional to an amount of the plurality of sub-reflectors.

10. The toroidal compact antenna test range system as recited in claim 9, wherein the main reflector is the full torus, a number of the plurality of sub-reflectors is M, M is an integer greater than or equal to 2, and the coverage angle of each of the plurality of sub-reflectors is expressed by: 360°/M.

11. The toroidal compact antenna test range system as recited in claim 9, wherein the main reflector is a half torus, the amount of the plurality of sub-reflectors is N, N is an integer greater than or equal to 2, and the coverage angle of each of the plurality of sub-reflectors is expressed by: 180°/N.

* * * * *